United States Patent
Jiang et al.

(10) Patent No.: US 9,841,639 B2
(45) Date of Patent: Dec. 12, 2017

(54) TOUCH DISPLAY PANEL AND FABRICATION METHOD THEREOF, AND DISPLAY DEVICE

(71) Applicants: BOE TECHNOLOGY GROUP CO., LTD., Beijing (CN); BEIJING BOE OPTOELECTRONICS TECHNOLOGY CO., LTD., Beijing (CN)

(72) Inventors: Wenbo Jiang, Beijing (CN); Xiaochuan Chen, Beijing (CN); Yue Li, Beijing (CN); Hailin Xue, Beijing (CN)

(73) Assignees: BOE TECHNOLOGY GROUP CO., LTD., Beijing (CN); BEIJING BOE OPTOELECTRONICS TECHNOLOGY CO., LTD., Beijing (CN)

( * ) Notice: Subject to any disclaimer, the term of this patent is extended or adjusted under 35 U.S.C. 154(b) by 323 days.

(21) Appl. No.: 14/355,244

(22) PCT Filed: Jun. 26, 2013

(86) PCT No.: PCT/CN2013/077961
§ 371 (c)(1),
(2) Date: Apr. 30, 2014

(87) PCT Pub. No.: WO2014/146370
PCT Pub. Date: Sep. 25, 2014

(65) Prior Publication Data
US 2016/0062187 A1 Mar. 3, 2016

(30) Foreign Application Priority Data
Mar. 19, 2013 (CN) .......................... 2013 1 0088712

(51) Int. Cl.
*G02F 1/1343* (2006.01)
*H01L 27/12* (2006.01)
(Continued)

(52) U.S. Cl.
CPC ...... *G02F 1/134309* (2013.01); *G02F 1/1368* (2013.01); *G02F 1/133345* (2013.01);
(Continued)

(58) Field of Classification Search
CPC ............. G02F 1/134309; G02F 1/1368; G02F 1/136227; G02F 1/136286;
(Continued)

(56) References Cited

U.S. PATENT DOCUMENTS

2005/0139922 A1   6/2005  Kim et al.
2005/0185119 A1*  8/2005  Tsai .................. G02F 1/133553
                                                           349/113
(Continued)

FOREIGN PATENT DOCUMENTS

CN     1637553 A     7/2005
CN     1917221 A     2/2007
(Continued)

OTHER PUBLICATIONS

First Chinese Office Action dated Mar. 29, 2016; Appln. No. 201310088712.9.
(Continued)

*Primary Examiner* — David Vu
*Assistant Examiner* — Mouloucoulaye Inoussa
(74) *Attorney, Agent, or Firm* — Ladas & Parry LLP (57) ABSTRACT

Embodiments of the invention provide an array substrate, a display panel and a display device. The array substrate comprises a pixel electrode layer. The pixel electrode layer comprises a first pixel electrode layer, a second pixel electrode layer and an insulation layer (104) provided between
(Continued)

the first pixel electrode layer and the second pixel electrode layer, the insulation layer (104) insulates the first pixel electrode layer from the second pixel electrode layer, and a pixel electrode (1031) of the first pixel electrode layer and a pixel electrode (1032) of the second pixel electrode layer are alternately arranged.

17 Claims, 6 Drawing Sheets

(51) Int. Cl.
*G02F 1/1333* (2006.01)
*G02F 1/1368* (2006.01)
*G09G 3/36* (2006.01)
*G02F 1/1362* (2006.01)

(52) U.S. Cl.
CPC .. *G02F 1/136227* (2013.01); *G02F 1/136286* (2013.01); *G09G 3/3648* (2013.01); *G09G 3/3659* (2013.01); *H01L 27/1214* (2013.01); *G02F 1/136213* (2013.01); *G02F 2201/123* (2013.01); *G09G 2300/0426* (2013.01); *G09G 2300/0809* (2013.01); *G09G 2310/02* (2013.01)

(58) Field of Classification Search
CPC ........ G02F 1/134363; G02F 1/133514; G09G 3/3648; G09G 3/3659; H01L 27/1214; H01L 29/04; H01L 27/124; H01L 29/78633; H01L 27/12
USPC ....... 257/72, 59, 57; 438/149; 349/110, 187, 349/39, 114, 141, 48
See application file for complete search history.

(56) References Cited

U.S. PATENT DOCUMENTS

| | | |
|---|---|---|
| 2007/0045636 A1 | 3/2007 | Kang et al. |
| 2007/0258019 A1* | 11/2007 | Ono ................. G02F 1/134363 349/38 |
| 2009/0225250 A1* | 9/2009 | Lyu ................... G02F 1/134363 349/44 |
| 2010/0296040 A1 | 11/2010 | Han et al. |
| 2012/0028391 A1 | 2/2012 | Tanaka |
| 2012/0161142 A1 | 6/2012 | Sun et al. |
| 2013/0127792 A1 | 5/2013 | Chang et al. |

FOREIGN PATENT DOCUMENTS

| | | |
|---|---|---|
| CN | 101017835 A | 8/2007 |
| CN | 102540569 A | 7/2012 |
| CN | 102566155 A | 7/2012 |
| CN | 102629056 A | 8/2012 |
| TW | 201020657 A | 6/2010 |

OTHER PUBLICATIONS

International Search Report for International Application No. PCT/CN2013/077961, 14 pgs.
International Preliminary Report on Patentability Appln. No. PCT/CN2013/077961; dated Sep. 22, 2015.

* cited by examiner

TOUCH DISPLAY PANEL AND FABRICATION METHOD THEREOF, AND DISPLAY DEVICE

CROSS REFERENCE TO RELATED APPLICATIONS

This application is based on International Application No. PCT/CN2013/077961 filed on Jun. 26, 2013, which claims priority to Chinese National Application No. 201310088712.9 filed on Mar. 19, 2013. The entire contents of each and every foregoing application are incorporated herein by reference.

TECHNICAL FIELD

Embodiments of the invention relate to an array substrate, a display panel and a display device.

BACKGROUND

With the wide application of the liquid crystal display device, users raise higher and higher requirements for the liquid crystal display device, especially in terms of increasing the aperture ratio. The "aperture ratio" refers to the ratio of an area of a portion of a pixel where light is transmitted to the entire area of the pixel without considering the wiring portion and the transistor portion (which are generally blocked by a black matrix) of the pixel. The higher the aperture ratio is, the more the light is transmitted.

Figure 1:
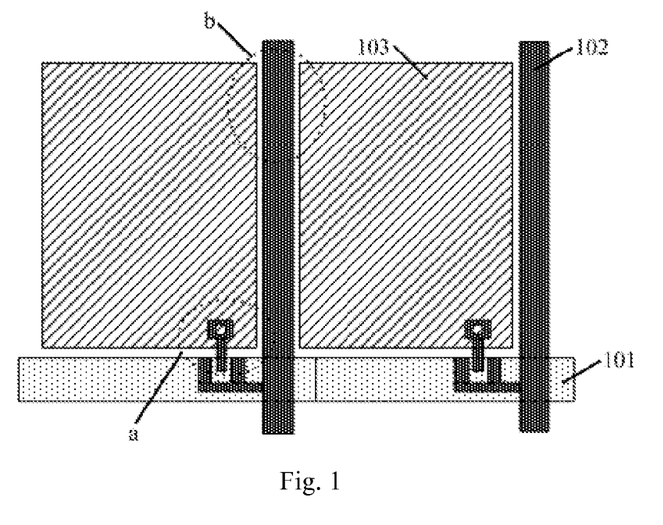
FIG. 1 is a schematic view illustrating a pixel structure of a conventional array substrate.

At present, a pixel electrode layer in the liquid crystal display device is formed by a sputtering process after forming a passivation layer. The whole pixel electrode layer is provided in a same plane, i.e. it belongs to a same layer. FIG. 1 is a schematic view illustrating a pixel structure of a conventional array substrate. In FIG. 1, the reference number 101 denotes a gate line layer, the reference number 102 denotes a data line layer, and the reference number 103 denotes a pixel electrode layer. As shown in FIG. 1, the pixel electrode layer 103 is provided in a same plane, i.e. it belongs to a same layer.

Figure 2:
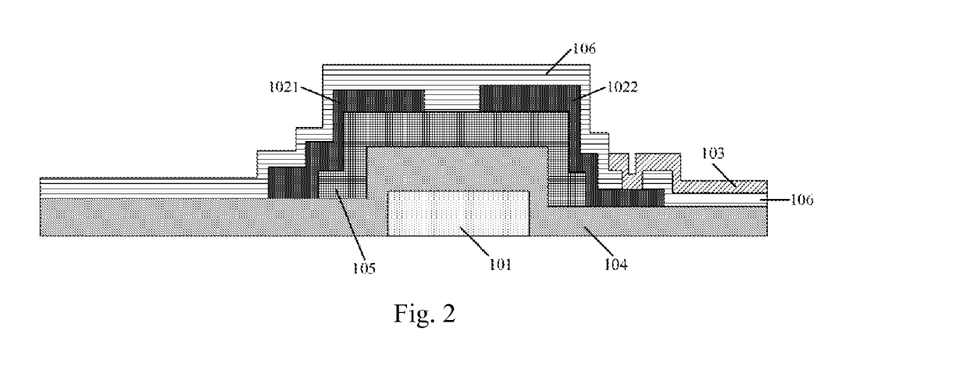
FIG. 2 is a cross-sectional schematic view illustrating a region a in FIG. 1.
Figure 3:
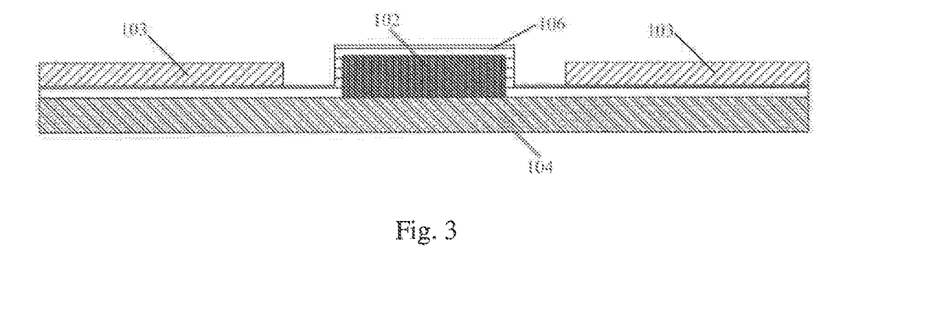
FIG. 3 is a cross-sectional schematic view illustrating a region b in FIG. 1.

FIG. 2 is a cross-sectional schematic view illustrating a region a in FIG. 1. As shown in FIG. 2, a gate line layer 101, a gate insulation layer 104, an active layer 105, a data line layer 102 (comprising a source electrode 1021 and a drain electrode 1022), a passivation layer 106 and a pixel electrode layer 103 are sequentially formed from bottom to top, and the pixel electrode layer 103 is connected to the data line layer 102 through a via hole in the passivation layer 106. FIG. 3 is a cross-sectional schematic view illustrating a region b in FIG. 1. As shown in FIG. 3, this region b comprises the gate insulation layer 104, the data line layer 102, the passivation layer 106 and the pixel electrode layer 103 that are sequentially formed from bottom to top.

In the conventional array substrate as described above, since the pixel electrode layer is provided in the same plane (i.e. merely one pixel electrode layer is provided), pixel electrodes of adjacent pixels cannot be too close to each other. If the pixel electrodes of adjacent pixels are too close to each other, the pixel electrodes of adjacent pixels may be not completely separated from each other due to the limitation of the precision of the etching process, and thereby connections between pixel electrodes of adjacent pixels are caused. If the connections between the pixel electrodes of adjacent pixels occur for the pixel electrodes of adjacent pixels are not completely separated from each other by the etching process, the pixel electrode material remained between the pixel electrodes of adjacent pixels participates in the image display and an undesired bright spot is resulted. At present, a relatively large gap (which is determined according to the precision of the etching process) is provided between the pixel electrodes of adjacent pixels in order to solve the above-described problem. However, in the case that the relatively large gap is provided between the pixel electrodes of adjacent pixels, the area of the pixel electrode is reduced, and thereby the display region is reduced and the aperture ratio is reduced as well.

SUMMARY OF THE INVENTION

According to an embodiment of the invention, an array substrate is provided. The array substrate comprises a pixel electrode layer. The pixel electrode layer comprises a first pixel electrode layer, a second pixel electrode layer and an insulation layer provided between the first pixel electrode layer and the second pixel electrode layer, the insulation layer insulates the first pixel electrode layer from the second pixel electrode layer, and a pixel electrode of the first pixel electrode layer and a pixel electrode of the second pixel electrode layer are alternately arranged.

According to another embodiment of the invention, a display panel is provided. The display panel comprises the above-described array substrate.

According to still another embodiment of the invention, a display device is provided. The display device comprises the above-described display panel.

In the array substrate, the display panel and the display device according to the embodiments of the invention, two pixel electrode layers that are in different layers are provided. Therefore, the area of each pixel electrode can be increased, so that the aperture ratio can be increased without causing the connections between the pixel electrodes of adjacent pixels. In addition, a storage capacitance can be greatly improved, which can efficiently avoid defects such as flicker.

BRIEF DESCRIPTION OF THE DRAWINGS

In order to clearly illustrate the technical solution of the embodiments of the invention, the drawings of the embodiments will be briefly described in the following; it is obvious that the described drawings are only related to some embodiments of the invention and thus are not limitative of the invention.

DESCRIPTION OF THE EMBODIMENTS

In order to make objects, technical details and advantages of the embodiments of the invention apparent, the technical solutions of the embodiment will be described in a clearly and fully understandable way in connection with the drawings related to the embodiments of the invention. It is obvious that the described embodiments are just a part but not all of the embodiments of the invention. Based on the described embodiments herein, those skilled in the art can obtain other embodiment(s), without any inventive work, which should be within the scope of the invention.

Figure 11:
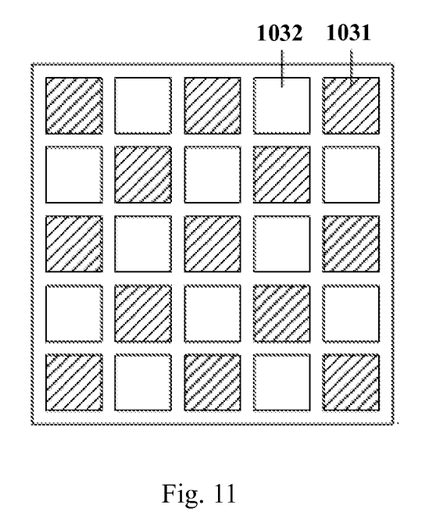
FIG. 11 is a schematic view illustrating that pixel electrodes are alternately arranged according to an embodiment of the invention.

Embodiments of the invention provide an array substrate comprising a pixel electrode layer. The pixel electrode layer comprises a first pixel electrode layer, a second pixel electrode layer and an insulation layer provided between the first pixel electrode layer and the second pixel electrode layer, the insulation layer insulates the first pixel electrode layer from the second pixel electrode layer, and a pixel electrode of the first pixel electrode layer and a pixel electrode of the second pixel electrode layer are alternately arranged. As an example, FIG. 11 illustrates that the pixel electrode of the first pixel electrode layer and the pixel electrode of the second pixel electrode layer are alternately arranged. In FIG. 11, the reference number 1031 represents the pixel electrode of the first pixel electrode layer and the reference number 1032 represents the pixel electrode of the second pixel electrode layer. The pixel electrode 1031 and the pixel electrode 1032 are provided in different layers. It should be understood that, the arrangement manner of the pixel electrode of the first pixel electrode layer and the pixel electrode of the second pixel electrode layer is not limited to the alternative arrangement manner shown in FIG. 11, any arrangement manner that ensures the adjacent pixel electrodes are provided in different pixel electrode layers belongs to the invention.

For example, the array substrate according to the embodiments of the invention further comprises a gate insulation layer and a passivation layer. Correspondingly, the insulation layer provided between the first pixel electrode layer and the second pixel electrode layer comprises a first insulation layer and a second insulation layer, the first insulation layer is adjacent to the first pixel electrode layer and is the gate insulation layer, and the second insulation layer is adjacent to the second pixel electrode layer and is the passivation layer.

For example, the array substrate according to the embodiments of the invention further comprises a plurality of thin film transistors. Each of the thin film transistors has a drain electrode. The pixel electrode of the first pixel electrode layer is connected to the drain electrode through a via hole penetrating the gate insulation layer, and the pixel electrode of the second pixel electrode layer is connected to the drain electrode through a via hole penetrating the passivation layer.

For example, the insulation layer provided between the first pixel electrode layer and the second pixel electrode layer is provided in a same layer as the passivation layer.

It should be understood that, the array substrate according to the embodiments of the invention may be manufactured by a 5-mask process, a 6-mask process, or any other process using masks of feasible number. The subsequent description is made by taking the case that the array substrate is manufactured by the 6-mask process as an example; however the embodiments of the invention are not limited thereto and any other process using masks of feasible number can also be used to manufacture the array substrate according to the embodiments of the invention.

Figure 4:
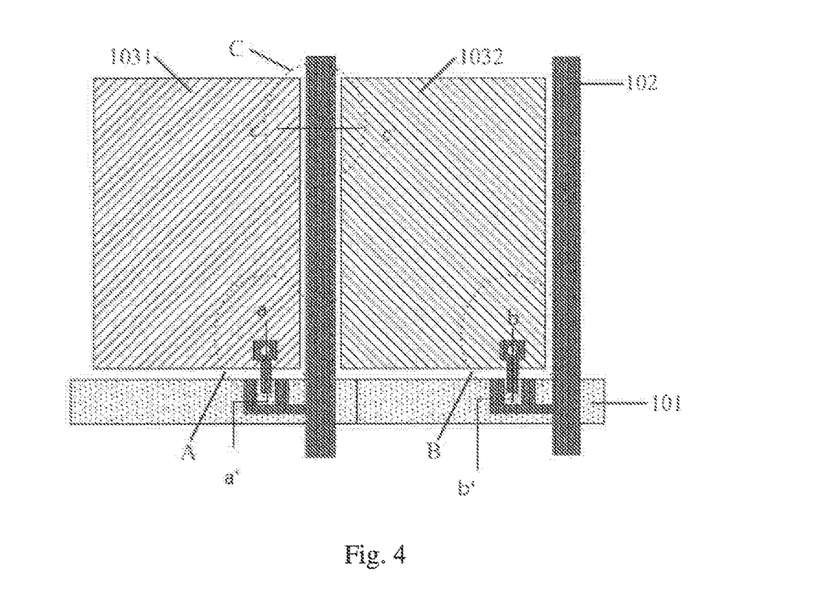
FIG. 4 is a schematic view illustrating a pixel structure of an array substrate according to an embodiment of the invention.

FIG. 4 is a schematic view illustrating a pixel structure of the array substrate according to the embodiments of the invention. In FIG. 4, the reference number 101 represents a gate line layer, the reference number 102 represents a date line layer, the reference number 1031 represents the pixel electrode of the first pixel electrode layer, and the reference number 1032 represents the pixel electrode of the second pixel electrode layer.

Figure 5:
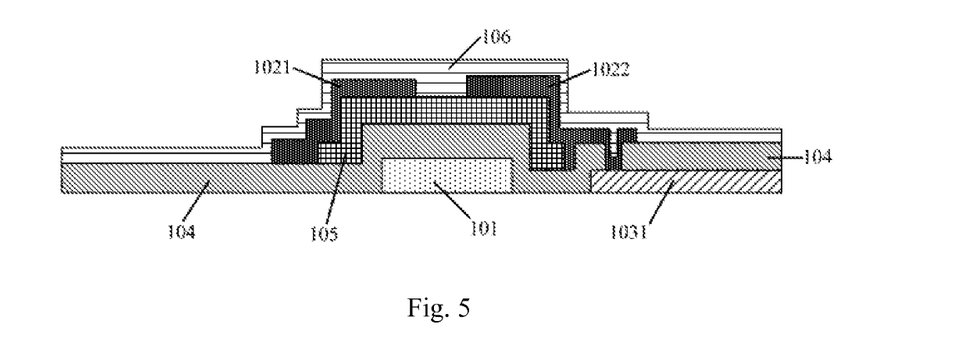
FIG.5 is a cross-sectional schematic view illustrating a region A taken along line a-a' in FIG.4.

FIG. 5 is a cross-sectional schematic view illustrating a region A in FIG. 4. As shown in FIG. 5, this region A comprises the gate line layer 101, the pixel electrode 1031 of the first pixel electrode layer, the gate insulation layer 104, an active layer 105, the data line layer 102 (comprising a source electrode 1021 and a drain electrode 1022) and the passivation layer 106 that are sequentially formed from bottom to top. The pixel electrode 1031 of the first pixel electrode layer is provided below the gate insulation layer 104 of the array substrate and is insulated from the gate line layer 101 of the array substrate by the gate insulation layer 104. The pixel electrode 1031 of the first pixel electrode layer is connected to the drain electrode 1022 of the thin film transistor through the via hole penetrating the gate insulation layer 104.

Figure 6:
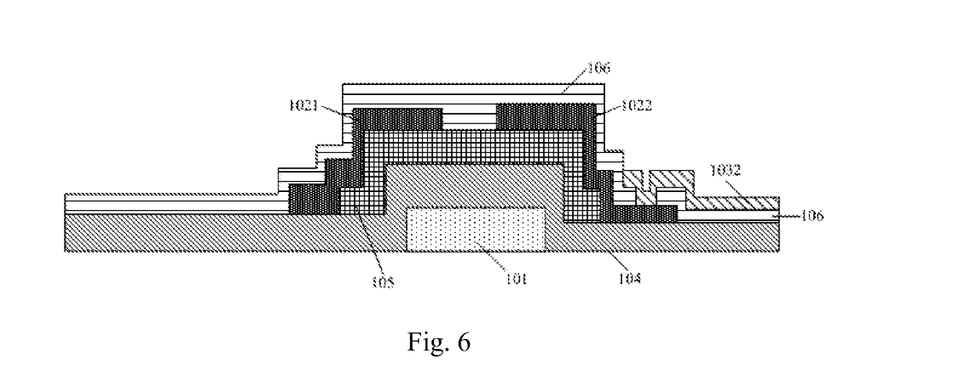
FIG.6 is a cross-sectional schematic view illustrating a region B taken along line b-b' in FIG.4.

FIG. 6 is a cross-sectional schematic view illustrating a region B in FIG. 4. As shown in FIG. 6, this region B comprises the gate line layer 101, the gate insulation layer 104, the active layer 105, the data line layer 102 (comprising the source electrode 1021 and the drain electrode 1022), the passivation layer 106 and the pixel electrode 1032 of the second pixel electrode that are sequentially formed from bottom to top. The pixel electrode 1032 of the second pixel electrode layer is provided on the passivation layer 106 of the array substrate and is connected to the drain electrode 1022 of the thin film transistor through the via hole penetrating the passivation layer 106.

Figure 7:
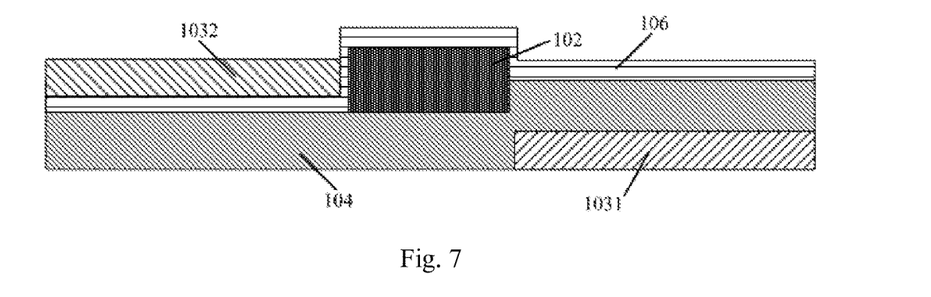
FIG.7 is a cross-sectional schematic view illustrating a region C taken along line c-c' in FIG.4.

FIG. 7 is a cross-sectional schematic view illustrating a region C in FIG. 4. As shown in FIG. 7, this region C comprises the pixel electrode 1031 of the first pixel electrode layer, the gate insulation layer 104, the data line layer 102, the passivation layer 106 and the pixel electrode 1032 of the second pixel electrode that are sequentially formed from bottom to top. It could be seen from FIG. 7 that the pixel electrode 1031 of the first pixel electrode layer is provided below the gate insulation layer 104 and the pixel electrode 1032 of the second pixel electrode layer is provided on the passivation layer 106.

In addition, the array substrate according to the embodiments of the invention may employ two passivation layers. In this case, the first pixel electrode layer is provided on a first passivation layer and below a second passivation layer, and the second pixel electrode layer is provided on the second passivation layer.

Embodiments of the invention further provide a method of manufacturing an array substrate. The method comprises: respectively forming the first pixel electrode and the second pixel electrode on a base substrate. The first pixel electrode layer and the second pixel electrode layer are provided in different layers, the insulation layer is provided between the first pixel electrode layer and the second pixel electrode layer, and the pixel electrode of the first pixel electrode layer and the pixel electrode of the second pixel electrode layer are alternately arranged.

For example, the first pixel electrode layer and the second pixel electrode layer are formed by a sputtering process.

For example, the first pixel electrode layer is formed after forming the gate line layer and before forming the gate insulation layer on the base substrate, and the first pixel electrode layer and the gate line layer are insulated from each other by the gate insulation layer. For example, the second pixel electrode layer is formed after forming the passivation layer on the base substrate.

For example, the first pixel electrode is connected to the drain electrode of the thin film transistor through the via hole penetrating the gate insulation layer, and the second pixel electrode layer is connected to the drain electrode of the thin film transistor through the via hole penetrating the passivation layer.

For example, the array substrate comprises two passivation layers. In this case, the first pixel electrode layer is formed after forming the first passivation layer and before forming the second passivation layer, and the second pixel electrode layer is formed after forming the second passivation layer.

For example, during manufacturing the array substrate according to the embodiments of the invention, the gate line layer, the first pixel electrode layer, the gate insulation layer, the active layer, the data line layer, the passivation layer and the second pixel electrode layer are sequentially formed from bottom to top.

In the case that the array substrate comprises two passivation layers, the gate line layer, the gate insulation layer, the active layer, the data line layer, the first passivation layer, the first pixel electrode layer, the second passivation layer and the second pixel electrode layer are sequentially formed from bottom to top during manufacturing the array substrate according to the embodiments of the invention.

Figure 8:
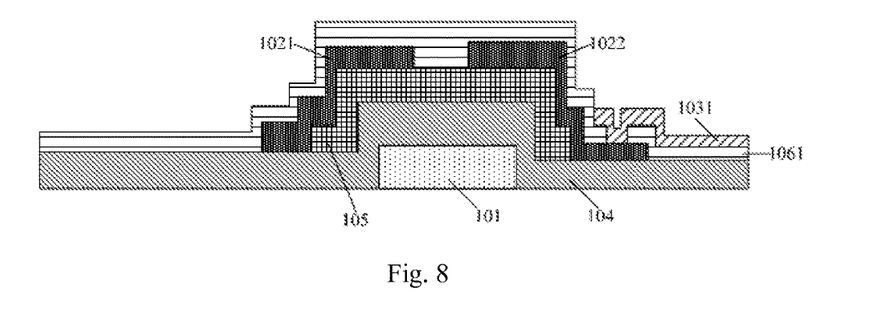
FIG. 8 is a cross-sectional schematic view illustrating a region A in FIG. 4.
Figure 9:
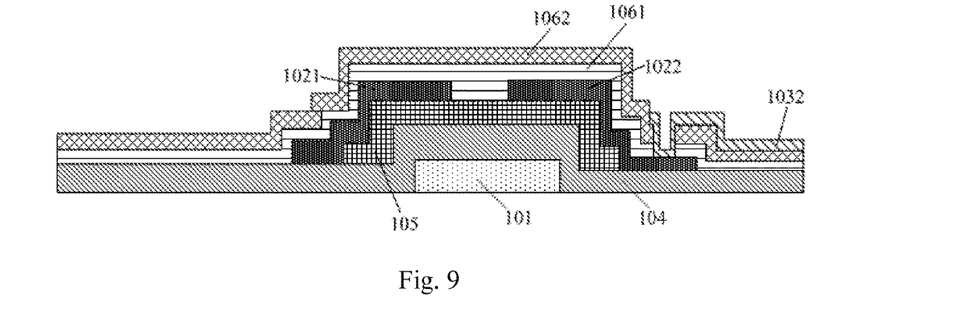
FIG. 9 is a cross-sectional schematic view illustrating a region B in FIG. 4.
Figure 10:
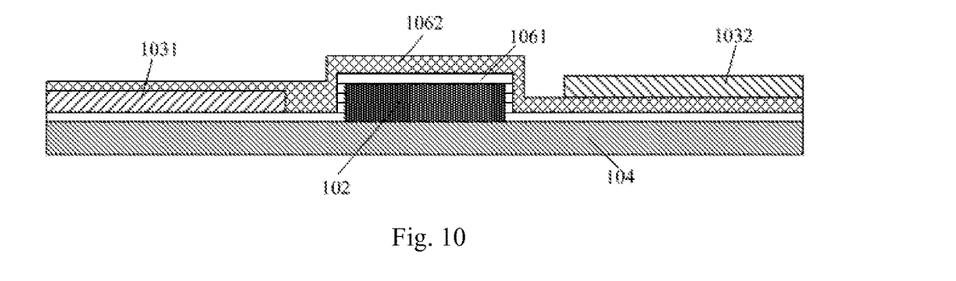
FIG. 10 is a cross-sectional schematic view illustrating a region C in FIG. 4.

The plane-view of the array substrate comprising two passivation layers can also refer to FIG. 4. FIG. 8 to FIG. 10 are cross-sectional schematic views of the array substrate comprising two passivation layers. FIG. 8 is a cross-sectional schematic view illustrating a region A in FIG. 4. As shown in FIG. 8, this region A comprises the gate line layer 101, the gate insulation layer 104, the active layer 105, the data line layer 102 (comprising the source electrode 1021 and the drain electrode 1022), the first passivation layer 106 and the pixel electrode 1031 of the first pixel electrode layer that are sequentially formed from bottom to top. The pixel electrode 1031 of the first pixel electrode layer is provided on the first passivation layer 1061 and is connected to the drain electrode 1022 of the thin film transistor through the via hole penetrating the first passivation layer 1061. FIG. 9 is a cross-sectional schematic view illustrating a region B in FIG. 4. As shown in FIG. 9, this region B comprises the gate line layer 101, the gate insulation layer 104, the active layer 105, the data line layer 102 (comprising the source electrode 1021 and the drain electrode 1022), the first passivation layer 1061, the second passivation layer 1062 and the pixel electrode 1032 of the second pixel electrode layer that are sequentially formed from bottom to top. The pixel electrode 1032 of the second pixel electrode layer is connected to the drain electrode 1022 of the thin film transistor through a via hole penetrating the first passivation layer 1061 and the second passivation layer 1062. FIG. 10 is a cross-sectional schematic view illustrating a region C in FIG. 4. As shown in FIG. 10, this region C comprises the gate insulation layer 104, the data line layer 102, the first passivation layer 1061, the pixel electrode 1031 of the first pixel electrode layer, the second passivation layer 1062 and the pixel electrode 1032 of the second pixel electrode layer that are sequentially formed from bottom to top.

It can be seen that, in the case that the array substrate comprises two passivation layers, the pixel electrode 1031 of the first pixel electrode layer is provided on the first passivation layer 1061 and below the second passivation layer 1062 and the pixel electrode 1032 of the second pixel electrode layer is provided on the second passivation layer 1062.

The pixel electrodes in the embodiments of the invention (comprising the pixel electrode of the first pixel electrode and the pixel electrode of the second pixel electrode) may be made of indium tin oxide (ITO) or any other suitable material. The array substrate according to the embodiments of the invention may employ a glass substrate, a flexible substrate or any other suitable substrate as the base substrate.

In the array substrate according to the embodiments of the invention, two pixel electrode layers that are in different layers are provided. Therefore, the area of each pixel electrode can be increased, so that the aperture ratio can be increased without causing the connections between the pixel electrodes of adjacent pixels. In addition, in the case that the area of each pixel electrode on the array substrate is increased, the area of a black matrix on an opposite substrate can be correspondingly reduced. In addition, in the array substrate according to the embodiments of the invention, a storage capacitance can be greatly improved, which can efficiently avoid defects such as flicker.

The foregoing embodiments merely are exemplary embodiments of the invention, and not intended to define the scope of the invention, and the scope of the invention is determined by the appended claims.

What is claimed is:

1. An array substrate, comprising a pixel electrode layer, wherein
the pixel electrode layer comprises a first pixel electrode layer, a second pixel electrode layer and an insulation layer provided between the first pixel electrode layer and the second pixel electrode layer, the insulation layer insulates the first pixel electrode layer from the second pixel electrode layer, and a pixel electrode of the first pixel electrode layer and a pixel electrode of the second pixel electrode layer are alternately arranged;
wherein the first pixel electrode layer and the second pixel electrode layer are disposed in different horizontal planes and non-overlapped horizontally and vertically with each other and are made of indium tin oxide.

2. The array substrate according to claim 1, wherein
the array substrate further comprises a gate insulation layer and a pass nation layer; and
the insulation layer comprises a first insulation layer and a second insulation layer, the first insulation layer is adjacent to the first pixel electrode layer and is the gate insulation layer, and the second insulation layer is adjacent to the second pixel electrode layer and is the passivation layer.

3. The array substrate according to claim 2, wherein
the array substrate further comprises a plurality of thin film transistors, and each of the thin film transistors has a drain electrode; and
the pixel electrode of the first pixel electrode layer is connected to the drain electrode through a via hole penetrating the gate insulation layer, and the pixel electrode of the second pixel electrode layer is connected to the drain electrode through a via hole penetrating the passivation layer.

4. An array substrate, comprising a pixel electrode layer, wherein the pixel electrode layer comprises a first pixel electrode layer, a second pixel electrode layer and an insulation layer provided between the first pixel electrode layer and the secdond pixel electrode layer, the insulation layer insulates the first pixel electrode layer from the second pixel electrode layer, and a pixel electrode of the first pixel electrode layer and a pixel electrode of the second pixel electrode layer are alternately arranged;

wherein the first pixel electrode layer and the second pixel electrode layer are disposed in different horizontal planes and non-verlapped with each other and are made of indium tin oxide,wherein the array substrate further comprises a first passivation layer and a second passivation layer; and the insulation layer is the second passivation layer, the first pixel electrode layer is provided on the first passivation layer and below the second passivation layer, and the second pixel electrode layer provided on the second passivation layer.

5. The array substrate according to claim 4, wherein the array substrate further comprises a plurality of thin film transistors, and each of the thin film transistors has a drain electrode; and the pixel electrode of the first pixel electrode layer is connected to the drain electrode through a via hole penetrating the first passivation layer, and the pixel electrode of the second pixel electrode layer is connected to the drain electrode through a via hole penetrating the first passivation layer and the second passivation layer.

6. A display panel, comprising an array substrate according to claim 1.

7. A display device, comprising a display panel according to claim 6.

8. The array substrate according to claim 3, wherein the array substrate comprises:

a gate line layer and the pixel electrode of the first pixel electrode layer, provided in a same layer and insulated from each other by the gate insulating layer;

the gate insulation layer, provided on the gate line layer and the pixel electrode of the first pixel electrode layer;

an active layer, provided on the gate insulation layer;

a data line layer, provided on the active layer and comprising a source electrode and the drain electrode;

the passivation layer, provided on the data line layer; and the pixel electrode of the second pixel electrode layer, provided on the passivation layer.

9. The array substrate according to claim 5, wherein the array substrate comprises:

a gate line layer;

a gate insulation layer, provided on the gate line layer:

an active layer, provided on the gate insulation layer;

a data line layer, provided on the active layer and comprising a source electrode and the drain electrode;

the first pass nation layer, provided on the data line layer;

the pixel electrode of the first pixel electrode layer, provided on the first passivation layer;

the second pass nation layer, provided on the pixel electrode of the first pixel electrode layer; and the pixel electrode of the second pixel electrode layer, provided on the second passivation layer.

10. The display panel according to claim 6, wherein the array substrate further comprises a gate insulation layer and a passivation layer; and the insulation layer comprises a first insulation layer and a second insulation layer, the first insulation layer is adjacent to the first pixel electrode layer and is the gate insulation layer, and the second insulation layer is adjacent to the second pixel electrode layer and is the passivation layer.

11. The display panel according to claim 10, wherein the array substrate further comprises a plurality of thin film transistors, and each of the thin film transistors has a drain electrode; and the pixel electrode of the first pixel electrode layer is connected to the drain electrode through a via hole penetrating the gate insulation layer, and the pixel electrode of the second pixel electrode layer is connected to the drain electrode through a via hole penetrating the passivation layer.

12. The display panel according to claim 10, wherein the array substrate comprises:

a gate line layer and the pixel electrode of the first pixel electrode layer, provided in a same layer and insulated from each other by the gate insulating layer;

the gate insulation layer, provided on the gate line layer and the pixel electrode of the first pixel electrode layer;

an active layer, provided on the gate insulation layer;

a data line layer, provided on the active layer and comprising a source electrode and the drain electrode;

the passivation layer, provided on the data line layer; and the pixel electrode of the second pixel electrode layer, provided on the passivation layer.

13. The display panel according to claim 6, wherein the array substrate further comprises a first passivation layer and a second passivation layer; and the insulation layer is the second passivation layer, the first pixel electrode layer is provided on the first passivation layer and below the second passivation layer, and the second pixel electrode layer provided on the second passivation layer.

14. The display panel according to claim 13, wherein the array substrate further comprises a plurality of thin film transistors, and each of the thin film transistors has a drain electrode; and the pixel electrode of the first pixel electrode layer is connected to the drain electrode through a via hole penetrating the first passivation layer, and the pixel electrode of the second pixel electrode layer is connected to the drain electrode through a via hole penetrating the first passivation layer and the second passivation layer.

15. The display panel according to claim 14, wherein the array substrate comprises:

a gate line layer;

a gate insulation layer, provided on the gate line layer;

an active layer, provided on the gate insulation layer;

a data line layer, provided on the active layer and comprising a source electrode and the drain electrode;

the first passivation layer, provided on the data line layer;

the pixel electrode of the first pixel electrode layer, provided on the first passivation layer;

the second passivation layer, provided on the pixel electrode of the first pixel electrode layer; and the pixel electrode of the second pixel electrode layer, provided on the second passivation layer.

16. The array substrate according to claim 1, wherein the first pixel electrode and the second pixel electrode have same electrode pattern.

17. The array substrate according to claim 1, wherein the electrode pattern is in form of flat plate.

* * * * *